United States Patent
Patti

(10) Patent No.: US 6,642,081 B1
(45) Date of Patent: Nov. 4, 2003

(54) INTERLOCKING CONDUCTOR METHOD FOR BONDING WAFERS TO PRODUCE STACKED INTEGRATED CIRCUITS

(76) Inventor: Robert Patti, 1 S. 751 Avon Dr., Warrenville, IL (US) 60555

(*) Notice: Subject to any disclaimer, the term of this patent is extended or adjusted under 35 U.S.C. 154(b) by 0 days.

(21) Appl. No.: 10/122,084

(22) Filed: Apr. 11, 2002

(51) Int. Cl.[7] .............................................. H01L 21/30
(52) U.S. Cl. ........................ 438/109; 438/118; 438/459
(58) Field of Search ................................. 438/455, 459, 438/109, 118, 692, 997, FOR 45, FOR 111, FOR 426; 257/278

(56) References Cited

U.S. PATENT DOCUMENTS

| | | | | |
|---|---|---|---|---|
| 5,087,585 A | * | 2/1992 | Hayashi ...................... 438/155 |
| 5,229,647 A | * | 7/1993 | Gnadinger ................... 257/785 |
| 5,236,118 A | * | 8/1993 | Bower et al. ................ 228/193 |
| 5,380,681 A | * | 1/1995 | Hsu ............................. 438/109 |
| 5,627,106 A | * | 5/1997 | Hsu ............................. 438/459 |
| 6,352,923 B1 | * | 3/2002 | Hsuan et al. ................. 438/667 |
| 6,355,501 B1 | * | 3/2002 | Fung et al. ................... 438/107 |
| 6,372,632 B1 | * | 4/2002 | Yu et al. ....................... 438/634 |
| 6,482,677 B2 | * | 11/2002 | Sato et al. .................... 438/109 |
| 6,566,232 B1 | * | 5/2003 | Hara et al. ................... 438/455 |

* cited by examiner

*Primary Examiner*—George Fourson
*Assistant Examiner*—Fernando Toledo
(74) *Attorney, Agent, or Firm*—Calvin B. Ward

(57) ABSTRACT

An integrated circuit wafer element and an improved method for bonding the same to produce a stacked integrated circuit. Plugs that extend from one surface of the wafer into the wafer are used to provide vertical connections and to bond the wafers together. A stacked integrated circuit is constructed by bonding the front side of a new wafer to a wafer in the stack and then thinning the backside of the new wafer to a thickness that leaves a portion of the plugs extending above the surface of the backside of the thinned wafer. The elevated plug ends can then be used to bond another wafer by bonding to pads on the front side of that wafer. The mating bonding pads can include depressed regions that mate to the elevated plug ends.

5 Claims, 7 Drawing Sheets

INTERLOCKING CONDUCTOR METHOD FOR BONDING WAFERS TO PRODUCE STACKED INTEGRATED CIRCUITS

FIELD OF THE INVENTION

The present invention relates to integrated circuits, and more particularly, to a method for bonding wafers together to form integrated circuits having a stack of thin layers.

BACKGROUND OF THE INVENTION

Modern integrated circuits are typically constructed in a thin layer in a semiconducting layer on a substrate wafer such as silicon. This essentially two-dimensional structure limits both the size of the integrated circuit and the speed at which the circuit operates. The speed at which an integrated circuit operates is determined by the distance between the farthest separated components that must communicate with one another on the chip. For any given number of components, the path lengths will, in general, be significantly reduced if the circuit can be laid out as a three dimensional structure consisting of a number of vertically-stacked layers of circuitry, provided the vertical distances between the layers are much smaller than the width of the chips that make up the individual layers.

One promising scheme for providing such stacked structures utilizes a method for stacking and bonding entire wafers. In this method, integrated circuits are fabricated on conventional wafers. Two wafers are bonded vertically by thinning one wafer in a first coarse thinning operation by removing material from the back of the wafer. The circuitry on the front surface of each wafer is covered with an insulating layer having metal filled vias that make contact with the underlying circuitry and act as electrical connection points between the two wafers. In addition, the front surfaces of the wafers include bonding pads that are planar metal areas that do not connect to the underlying circuitry. The bonding pads are provided to increase the bonded area. The front surfaces of the wafers are then placed in contact with one another so that the bonding pads on one wafer are in contact with the pads on the other wafer. Thermal diffusion bonding is then used to bond the metal pads, and hence, the wafers together. One of the wafers is then further thinned to a thickness of a few microns by etching or mechanically grinding the back surface of that wafer further. Once the wafer has been thinned, a new set of vias is opened in the backside and filled with metal to provide the connection points to the pads on the front side of the wafer that make connections with the circuitry in the wafer. In addition, a new set of bonding pads is formed on the backside of the wafer so that another wafer can be bonded to the stack. The process is then repeated until the desired number of layers has been bonded to form the three-dimensional stack. The three-dimensional stack is then cut into three-dimensional chips and packaged.

Each time a top wafer in the stack is thinned, the wafers below that wafer are subjected to a significant amount of lateral stress by the grinding process. Accordingly, the bonds that hold the wafers together must withstand these large stresses. In principle, the ability of the wafers to withstand these stresses can be increased by increasing the bond area, i.e., devoting more area to bonding pads between the wafers. Unfortunately, this approach has the drawback of reducing the number of vertical conductors that can be provided in circuits requiring a high density of inter-layer vertical conductors.

This process also requires a considerable amount of "backside processing" to provide the new set of contacts on the backside of the wafer. The generation of the vertical conductors requires a number of masking and deposition steps. Each conductor is structurally similar to a golf tee. The "head" of the tee provides the area needed to accommodate alignment errors. Separate mask and deposition steps are required to etch the via that forms the stem of the tee and the head that sits on this stem. The via must also be lined to prevent diffusion of the metal into the surrounding silicon. Such extensive backside processing can substantially reduce the yield of stacked wafers.

The situation is made more complicated by the lack of fiduciary marks on the backside of the thinned wafer. Hence, precise alignment of the masks that define the locations of the vias with respect to the circuitry on the front side of the wafer is difficult. Misalignment of these vias leads to defects that render the entire stack of chips useless. In addition, the semiconductor processing steps required by the backside processing of the top layer subject the underlying layers to thermal and mechanical stresses that are repeated with each new layer.

Broadly, it is the object of the present invention to provide an improved method for stacking and thinning wafers to generate a three-dimensional integrated circuit.

It is a further object of the present invention to provide a method that eliminates the backside processing steps utilized in prior art stacking techniques.

These and other objects of the present invention will become apparent to those skilled in the art from the following detailed description of the invention and the accompanying drawings.

SUMMARY OF THE INVENTION

An integrated circuit wafer element and an improved method for bonding the same to produce a stacked integrated circuit. An integrated circuit wafer according to the present invention includes a substrate having first and second surfaces constructed from a wafer material, the first surface having a circuit layer that includes integrated circuit elements constructed thereon. A plurality of vias extend from the first surface through the circuit layer and terminate in the substrate at a first distance from the first surface. The vias include a stop layer located in the bottom of each via constructed from a stop material that is more resistant to chemical/mechanical polishing (CMP) than the wafer material. The vias may be filled with an electrically conducting material to provide vertical connections between the various circuit layers in a stacked integrated circuit. In this case, the electrical conducting vias may also be connected to various circuit elements by metallic conductors disposed in a dielectric layer that covers the circuit layer. A plurality of bonding pads are provided on one surface of the integrated circuit wafer. These pads may be part of the conducting plugs resulting from filling the vias with the conducting material. These pads preferably extend above the surface of the integrated circuit wafer. A stacked integrated circuit according to the present invention is constructed by bonding two integrated circuit wafers together utilizing the bonding pads. One of the integrated circuit wafers is then thinned to a predetermined thickness determined by the depth of the vias by chemical/mechanical polishing (CMP) of the surface of that integrated circuit wafer that is not bonded to the other integrated circuit wafer, the stop layer in the vias preventing the CMP from removing wafer material that is within the first distance from the first surface of the substrate of the wafer being thinned. The thinning operation leaves a portion of the plug in the via standing above the surface of the thinned substrate. A third wafer can then be bonded to the raised portion of the plug by bonding the raised portion of the plug to pads on the third wafer's surface. The bonding pads on the third wafer surface preferably include a depressed region for engaging the raised portion of the plugs on the second wafer.

DETAILED DESCRIPTION OF THE INVENTION

Figure 1:
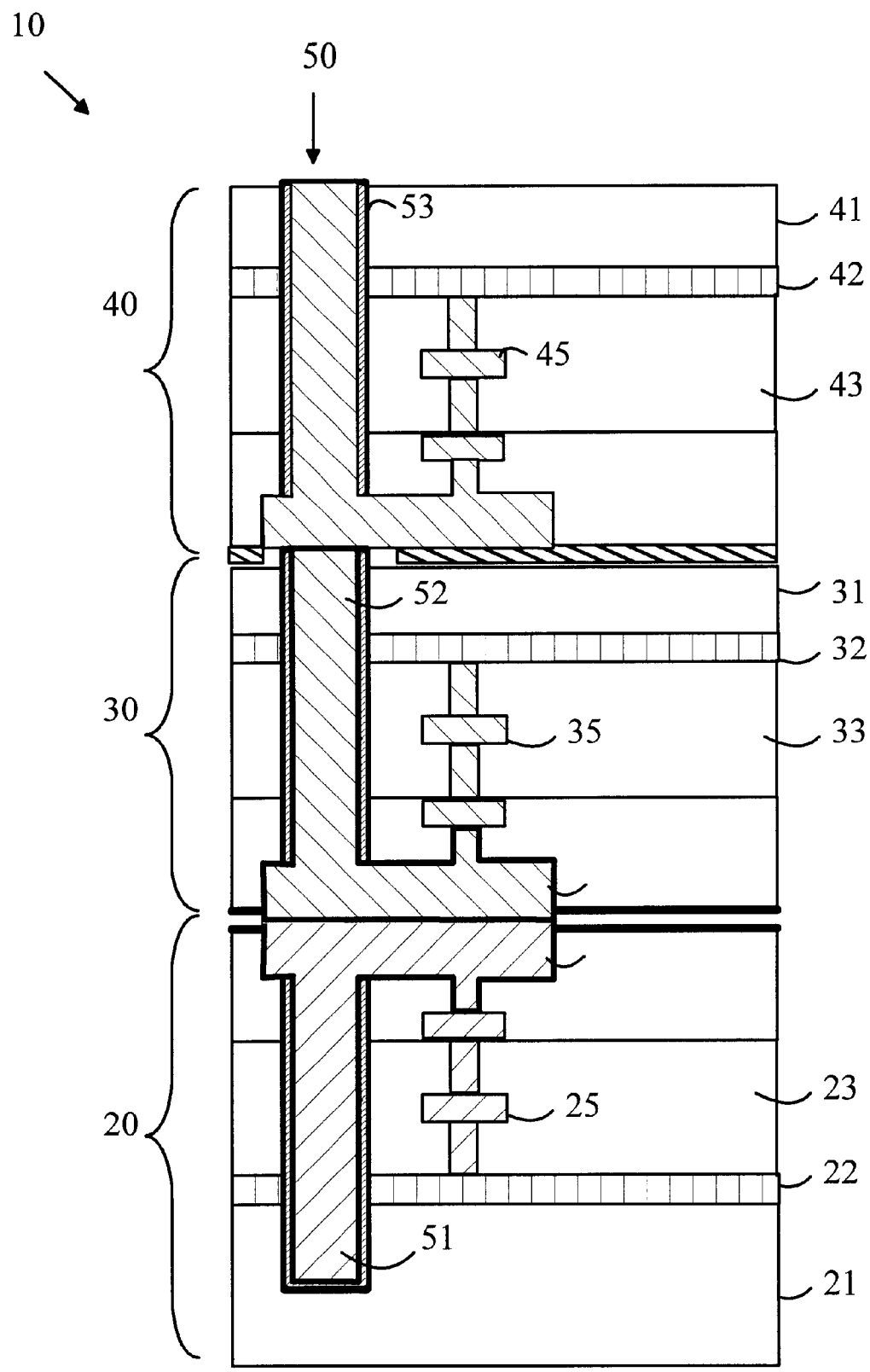
FIG. 1 is a cross-sectional view of a portion of a stacked integrated circuit 10 according to the present invention.

The manner in which the present invention provides its advantages may be more easily understood with reference to FIG. 1 which is a cross-sectional view of a portion of a stacked integrated circuit 10 according to the present invention having a base component layer 20 and two stacked component layers shown at 30 and 40. Each component layer includes an integrated circuit layer that is constructed on a substrate using conventional integrated circuit fabrication techniques. To simplify the following discussion, it will be assumed that the integrated circuit layer is constructed on a conventional silicon substrate in the form of a wafer. The integrated circuit layers corresponding to component layers 20, 30, and 40 are shown at 22, 32, and 42, respectively. The substrates on which these layers were constructed are shown at 21, 31, and 41, respectively. The integrated circuit layer is covered with one or more layers of dielectric such as $SiO_2$ in which various metal conductors are constructed and connected to the circuitry by vias. To simplify the drawing, only the metal conductors that are to be connected to components on other component layers are shown in the drawing. Exemplary conductors of this type are shown at 25, 35, and 45 together with the dielectric layers that are shown at 23, 33, and 43.

Connections between the various component layers are provided by vertical conductors that pass through one or more component layers. A typical vertical conductor is shown at 50. Vertical conductor 50 is constructed from component conductors shown at 51–53 by thermal diffusion bonding of the component conductors. The thermal diffusion bonding of the component conductors also bonds the various component layers together.

It should be noted that, in general, there are thousands, if not tens of thousands, of vertical conductors in a typical stacked integrated circuit. Hence, the diameters of the vias are preferably as small as possible. The minimum diameter of a via is determined by the aspect ratio permitted by the metallization process used to fill the via. Vias with aspect ratios of greater than 5 are difficult to fill reliability. Hence, it is advantageous to have the component layers be as thin as possible. In addition, thin component layers are more flexible. The flexibility improves the strength of the stacked structure and reduces cracking or other damage caused by thermal stress.

It should also be noted that it is important that the component layers be planar sheets having parallel top and bottom edges. In general, a stacked integrated circuit according to the present invention is constructed by bonding wafer-sized component layers. After all of the layers have bonded, the stacked structure is then divided into individual stacked chips. If the component layers become wedge shaped or have hills and valleys in the surface thereof due to fabrication errors, the bonding between layers will fail. In addition, the vertical vias will not be properly aligned in some areas of the chip. Hence, any economically practical wafer-stacking scheme must assure a high degree of precision over the entire wafer for each wafer component used. The manner in which the present invention provides this high degree of precision will now be discussed in detail.

For the purposes of the present discussion, the side of a wafer that contains the integrated circuits and conventional metallization layers such as the layers that contain conductors 25, 35, and 45 will be referred to as the "front side" of the wafer. The opposite side will be referred to as the "backside". A stacked wafer circuit such as that shown in FIG. 1 is constructed by first bonding wafers 20 and 30 via their front sides, and then bonding successive wafers such as wafer 40 by bonding the front side of the new wafer to the backside of the last wafer in the stack.

Figure 2:
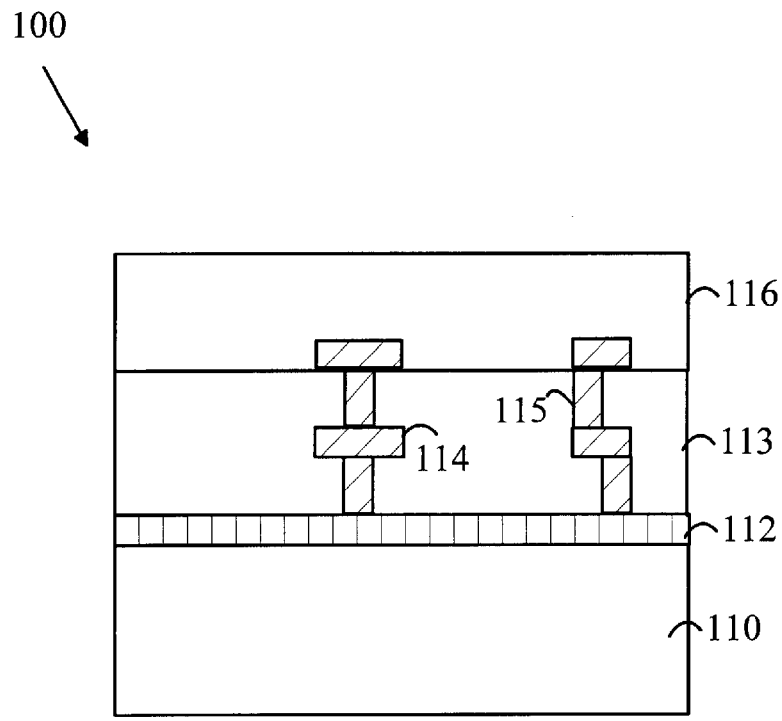
FIG. 2 is a cross-sectional view of a wafer 100 used as a starting point for a component layer.

Refer now to FIG. 2, which is a cross-sectional view of a wafer 100 used as a starting point for a component layer. It will be assumed that wafer 100 has its active circuit layer 112, which is covered with a dielectric layer 113, in place. As noted above, various metal conductors are typically constructed in the dielectric layer and connected to the circuitry by metal filled vias. Typical metal conductors are shown at 114 and 115. These conductors can be divided into two classes, those that provide connections between the various components in integrated circuit layer 112 and those that are to provide connections to components in other layers of the final stacked integrated circuit. Conductor 115 is in the first class, and conductor 114 is in the second class. It will also be assumed that a second layer of dielectric 116 covers the conductors.

Figure 3:
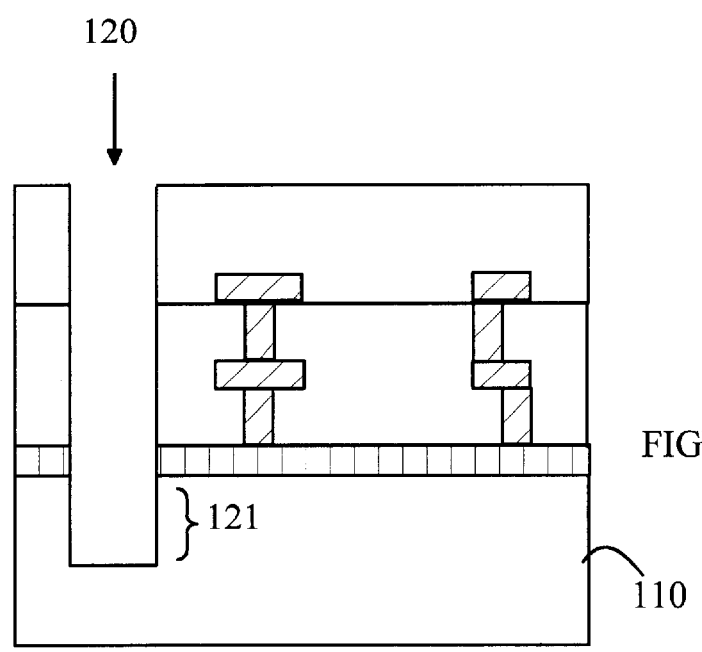
FIG. 3 is a cross-sectional view of wafer 100 after a via 120 has been etched through the dielectric layers and into substrate 110.

Refer now to FIG. 3, which is a cross-sectional view of wafer 100 after a via 120 has been etched through the dielectric layers and into substrate 110. As will be explained in more detail below, the depth 121 by which via 120 extends into substrate 110 is critical. Preferably, via 120 is etched in two steps. In the first step, the via is etched using an etchant that stops on the silicon substrate such as a fluorocarbon-based plasma etch. In the second step, the via is extended into substrate 110 by 4 to 9 microns using a timed halogen-containing gaseous plasma. It should be noted that the placement of the vias can be controlled precisely, since the wafer has fiduciary marks that are visible from the front side of the wafer, and these marks can be used to align the masks that define the via locations using conventional alignment tools.

Figure 4:
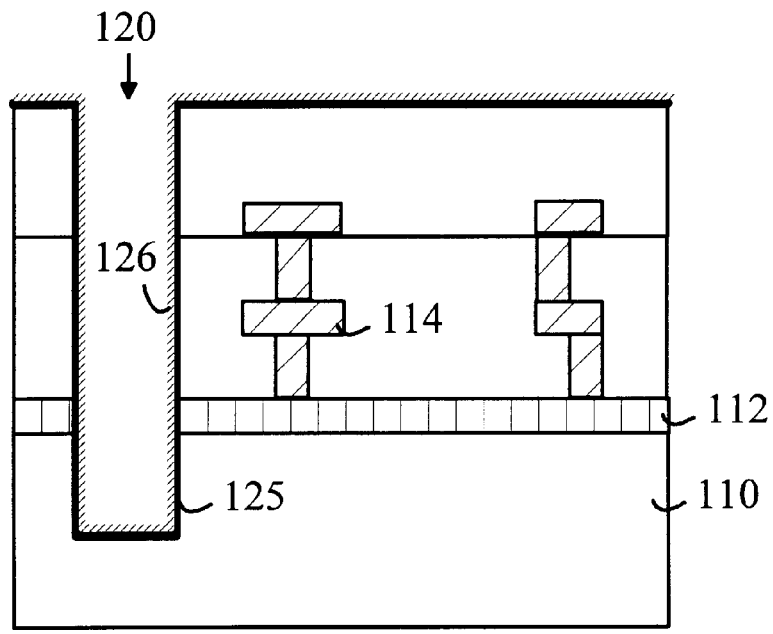
FIG. 4 is a cross-sectional view of wafer 100 after via 120 has been lined with two layers.

Refer now to FIG. 4, which is a cross-sectional view of wafer 100 after via 120 has been lined with two layers. Layer 125 consists of a thin dielectric layer, preferably 0.05 to 0.10 microns of $SiO_2$. This layer acts as an electrical insulator to prevent shorting between the metal layer of the filled via and components in the integrated circuit layer 112. The second layer 126 consists of a thin layer of SiN, typically 0.05 to 0.10 microns in thickness. The SiN layer serves two functions. First, it provides a diffusion barrier that helps to prevent the metal used to fill via 120 from diffusing into the integrated circuit layer if the primary diffusion barrier discussed below fails. Second, the silicon nitride provides an etch stop for the chemical etching processes used in the thinning of the silicon wafer. For example, the silicon can be thinned using a wet chemical process such as a substituted ammonium hydroxide or other alkaline chemical etches. It should also be noted that this etch stop will provide some resistance to acidic etch solutions. In this case, the silicon nitride acts as the etch stop. If a dry etch such as a $Cl_2$ based plasma chemistry is used to thin silicon, the $SiO_2$ layer can be used as an etch stop.

Figure 5:
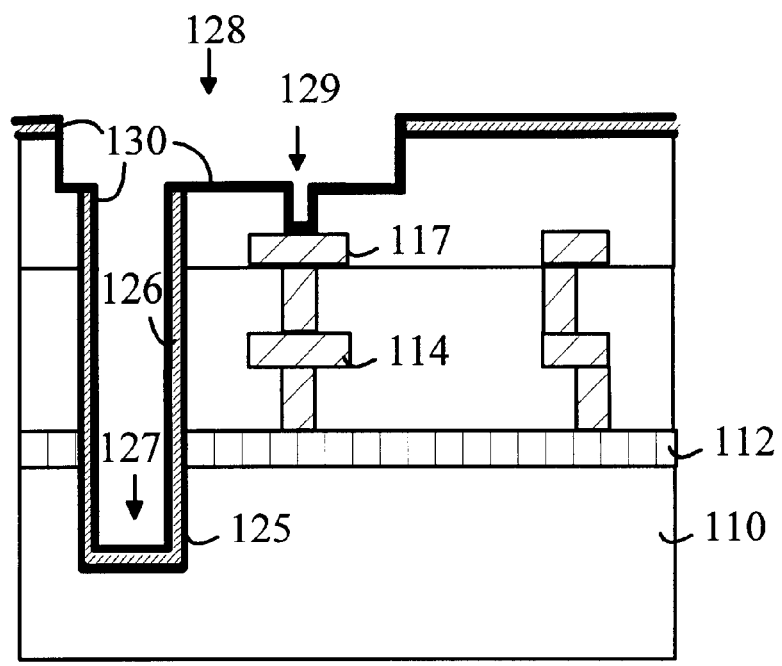
FIG. 5 is a cross-sectional view of wafer 100 after a trench 128 has been etched in dielectric layer 116.

Refer now to FIG. 5, which is a cross-sectional view of wafer 100 after a trench 128 has been etched in dielectric layer 116. A via 129 is opened in the bottom of trench 128 to provide contact with pad 117 that provides electrical connection to components in circuit layer 112 that are to be connected to the vertical conductor that will be formed by filling via 120 with metal. A third layer 130 is deposited in via 129 and trench 128. Layer 130 serves two functions. First, layer 130 acts as a diffusion barrier that prevents the metal used to filled the via and trench from diffusing into the remainder of the wafer. In the preferred embodiment of the present invention, the preferred metal is copper. The diffusion barrier is preferably Ta, TaN, or WN or other ternary barrier material such as $Ta_xSi_yN_z$, $W_2Si_yN_z$, etc. A 200–1000 Å barrier layer is preferably deposited by a CVD or a PVD process such as sputtering. Second, the portion of layer 130 at the bottom of via 127 acts as a stop in the wafer thinning process described below. Trench 128 is then filled with metal.

Figure 6:
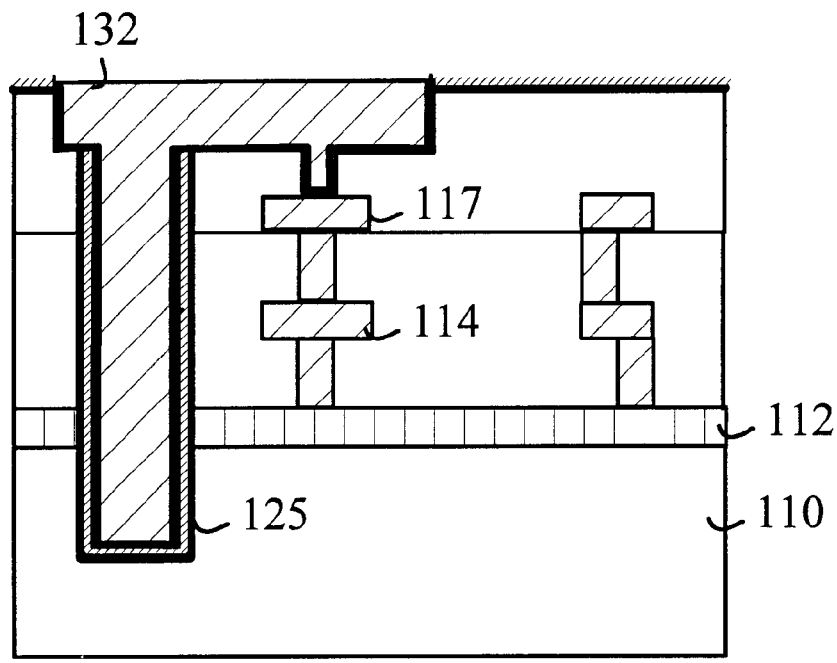
FIG. 6 illustrates a copper pad that is flush with the surrounding dielectric after the excess copper has been removed by chemical mechanical polishing (CMP).
Figure 7:
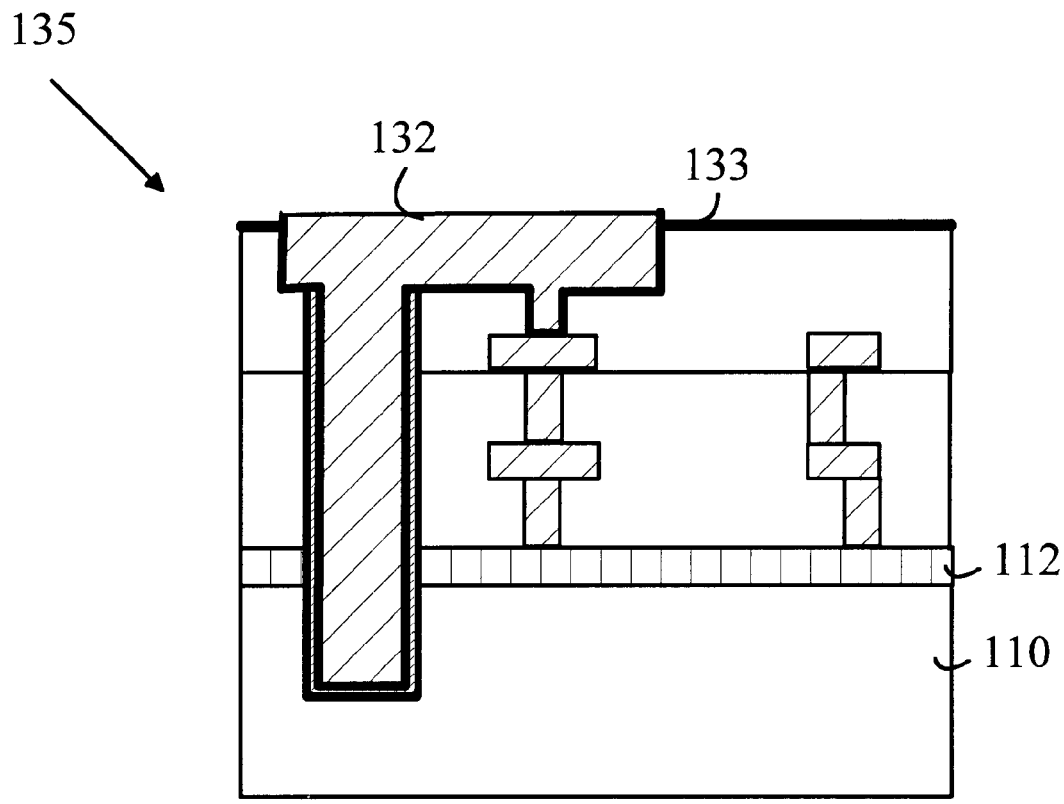
FIG. 7 is a cross-sectional view of a completed component layer element 135.

The preferred metal for the filling operation is copper. In embodiments utilizing copper, a copper seed layer is deposited in the trench and vias prior to the deposition of the copper. The seed layer can be deposited utilizing a CVD or a sputtering process. The seed layer maintains the proper conduction during the subsequent electro-plating process utilized to deposit the metallic copper. After the seed layer is deposited, the trench is filled with copper using electrochemical plating. The excess copper is removed by chemical mechanical polishing (CMP), leaving a copper pad that is flush with the surrounding dielectric as shown in FIG. 6. In the preferred embodiment of the present invention, the final copper pad 132 is elevated relative to the surrounding dielectric layer 133 by 0.01–0.2 microns as shown in FIG. 7, which is a cross-sectional view of a completed component layer element 135. This slightly elevated pad provides improved bonding when the component layer element is bonded as described below. The elevation of the pad can be accomplished by lowering the surrounding dielectric layer or by increasing the height of the copper. The dielectric layer can be lowered by selective etching using a fluorine containing etch process. The copper height can be increased by electroless deposition of additional copper, which will occur only on the exposed copper surface.

Figure 8:
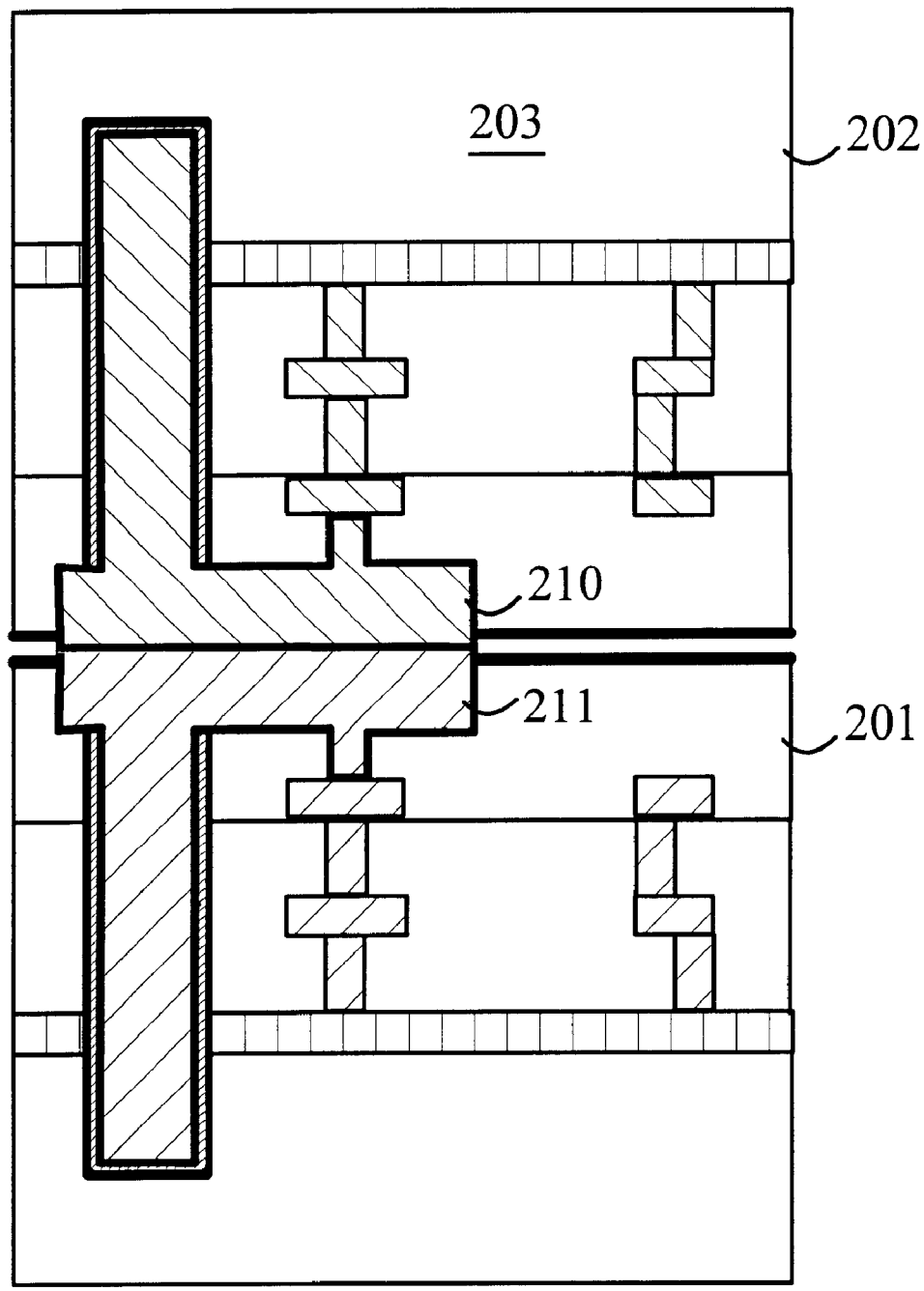
FIG. 8 is a cross-sectional view of a base component layer element 202 positioned relative to a component layer element 201 that is to be bonded to element 202.

The manner in which the first component layer is added to the base component layer by the front side bonding of two wafers will now be explained in more detail with reference to FIG. 8. FIG. 8 is a cross-sectional view of a base component layer element 202 positioned relative to a component layer element 201 that is to be bonded to element 202. The elements are positioned by turning element 201 over such that its copper bonding pads are positioned over the corresponding bonding pads on element 202. To simplify the drawing, only one pair of pads is shown at 210 and 211; however, it is to be understood that each component element may have thousands or even millions of such pads. The two component elements are pressed together and bonded using thermal diffusion bonding. The wafers are bonded by compressing the two wafers using 20–60 psi pressure at 300–450° C. temperature in a nitrogen or air atmosphere for 5–50 minutes. The wafers are positioned by utilizing fiducial marks on the front sides of the wafers. The marks on the front side of wafer 202 are viewed from the backside of the wafer. To improve the accuracy of the alignment, wafer 202 may be thinned prior to bonding.

Figure 9:
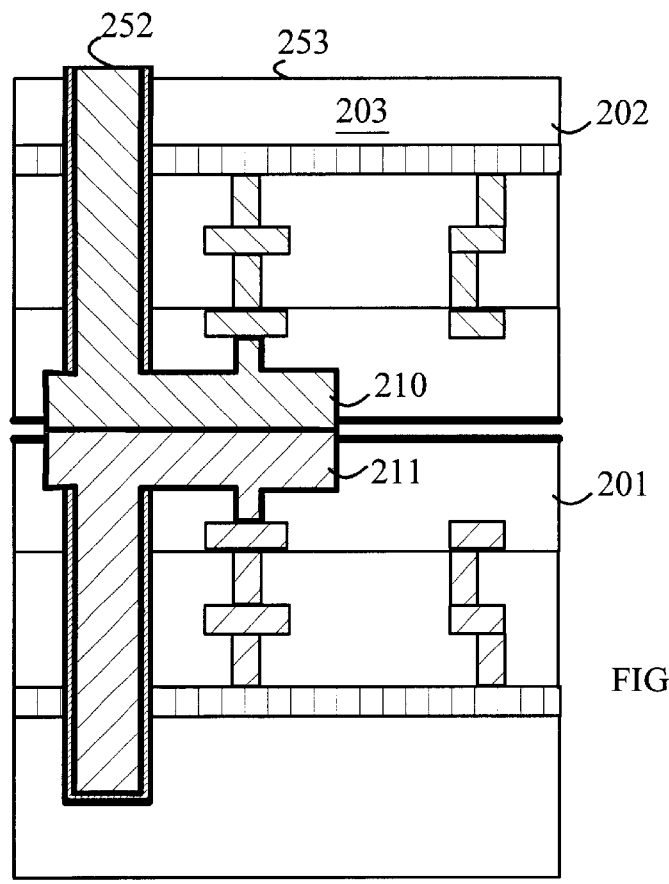
FIG. 9 is a cross-sectional view of the component layers after component layer element 202 has been thinned.

After the two elements have bonded, element 202 is thinned further to a thickness of a few microns as shown in FIG. 9 which is a cross-sectional view of the component layers after component layer element 202 has been thinned. As noted above, the resulting layer component must have parallel surfaces to assure that any subsequent element bonded to this element will be properly aligned and bonded. In the preferred embodiment of the present invention, the portion of the diffusion/stop layer shown at 130 in FIG. 5 in the bottom of the vertical vias is used as a stop for this thinning process. The preferred thinning process utilizes CMP of the substrate 203. The thinning process can be a combination of grinding and CMP and/or etch processes. For example, a CMP process will remove the silicon substrate at a rate that is 100 times faster than Ta in layer 130. Hence, the CMP process will stop at the same point on each of the vias. The depth of the vias, as noted above, can be controlled to a high degree of precision. Hence, the resulting component layer will have a thickness that is tightly controlled, since it is determined by the depth of the vias.

The silicon substrate is etched faster than the metal filled vias; hence, when the thinning process is completed, the end of the metal via 252 is elevated relative to the surface 253 of substrate 203. At this point, no further processing of the backside of wafer 202 is required.

Figure 10:
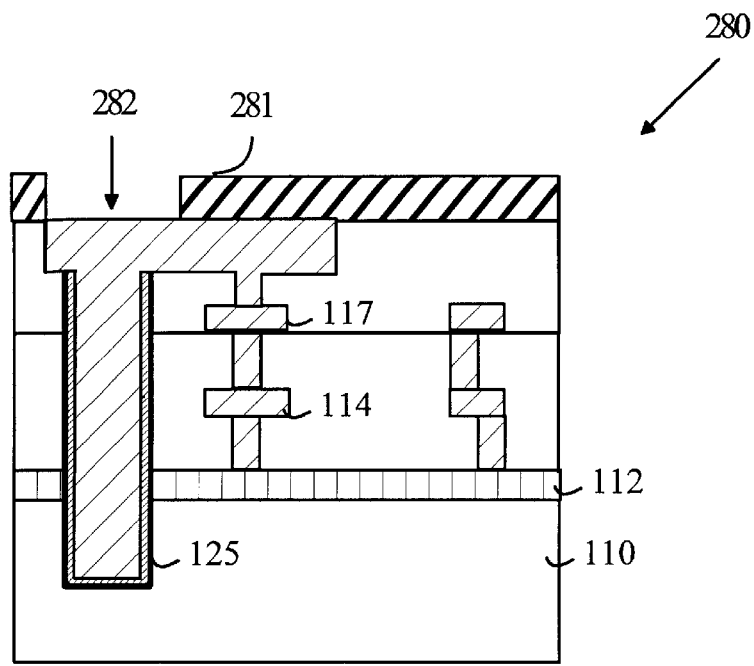
FIG. 10 is a cross-sectional view of component layer 135 shown in FIG. 7 after a socket 282 has been formed from a $SiO_2$ layer 281.

The stacking process can be continued by connecting pads on the front side of another wafer to the elevated posts on the backside of the last wafer that was added to the stack. In the preferred embodiment of the present invention, a "socket" is provided on the front side of each new wafer. The sockets engage the elevated "posts" described above. The sockets can be generated by any of a number of methods. One such method is illustrated in FIG. 10, which is a cross-sectional view of component layer 135 shown in FIG. 7 after a socket 282 has been formed from a $SiO_2$ layer 281. The thin layer of $SiO_2$ can be deposited over the front side of the next wafer by conventional techniques and a via opened in the layer to form the socket. The thickness of the $SiO_2$ layer must be less than the height with which conductor 252 extends over substrate 253.

Figure 11:
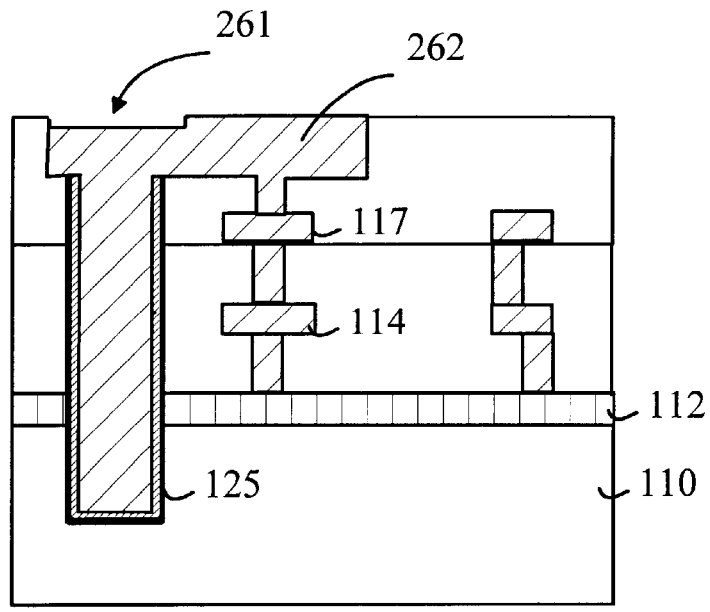
FIG. 11 is a cross-sectional view of component layer 135 shown in FIG. 7 after socket 261 has been etched.

The depression that forms the socket can also be generated by etching a depression 261 in the metal pad 262 on the front side of the component wafer as shown in FIG. 11, which is a cross-sectional view of component layer 135 shown in FIG. 7 after socket 261 has been etched. The etch area can be set by conventional masking operations. Once again, the depth of the depression should be less than the height with which conductor 252 extends over substrate 253.

Once the sockets have been formed in the front surface of the next component wafer to be added to the stack, the wafer is positioned over the backside of the last wafer in the stack and bonded thereto as described above. The positioning operation preferably utilizes a new front-side fiducial mark that is generated using the filled vias as references. Alternatively, the filled vias can be used as fiducial marks.

After bonding, the new component element is thinned as described above. This process may be continued with additional component elements until the desired stack thickness is obtained.

The above-described embodiments of the present invention utilize a socket that mates with the extended post on the backside of the last component layer in the stack. The socket provides additional resistance to lateral stress such as that generated in the thinning operations. However, if there are a sufficient number of binding sites between the component wafers, this additional stress resistance is not needed. In such cases, the extended posts can be bonded directly to the metal pads on the front side of the next wafer to be added.

The above-described embodiments of the present invention have utilized vertical conductors that serve both as bonding points between the component wafers and also as signal or power conduction paths that run vertically through the stack. In addition, there must be a sufficient density of posts in the wafer to provide the etch stop function during the thinning process. If the density of posts is too low, "dishing" can occur in the regions between the posts. In the preferred embodiment of the present invention, the distance between vias is less than 50 $\mu$M and the wafers are thinned to a thickness of 1 to 25 $\mu$M.

Figure 12:
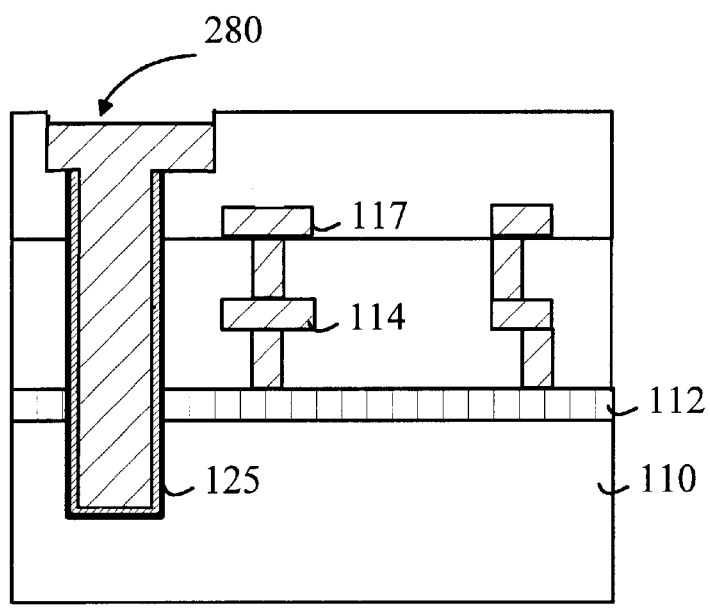
FIG. 12 is a cross-sectional view of a portion of a component wafer.

If the particular integrated circuit design does not provide sufficient vertical conductors to provide enough bonding points to assure that the wafers remain bonded together, additional bonding points can be provided. Such bonding points are preferably similar to those used for vertical conduction paths. However, since these bonding pads do not need to connect to the internal conductors in the component wafers, the lateral extent of such pads may be substantially less. A typical bonding point is shown at 280 in FIG. 12, which is a cross-sectional view of a portion of a component wafer.

It should be noted that the bonding points that hold the various component wafers together extend through the component wafers. This arrangement provides a significant improvement in the stress levels that can be accommodated by the bonded wafers. For example, prior art schemes that utilize metal pads that are deposited on the opposing surfaces of the bonded layers provide less resistance to lateral stresses. To provide a resistance similar to that provided by the present invention, the area of the pads must be substantially increased. However, this can led to "peeling" of the pads off of the surface of the wafers because of the different thermal expansion coefficients of the pads and the underlying silicon.

Various modifications to the present invention will become apparent to those skilled in the art from the foregoing description and accompanying drawings. Accordingly, the present invention is to be limited solely by the scope of the following claims.

What is claimed is:

1. A method for adding a second circuit layer to a first wafer comprising a first circuit layer, said method comprising the steps of:
    providing a plurality of bonding pads on a first surface of said first wafer;
    providing a second wafer comprising a substrate of a wafer material and said second circuit layer, said second circuit layer being fabricated on a first surface of said substrate and being covered by a layer of dielectric material, said wafer further comprising a plurality of vias extending a predetermined distance from said first surface of said substrate into said substrate, said vias including a layer of stop material, said stop material being more resistant to CMP than said wafer material;
    providing a plurality of bonding pads on said second wafer, there being a one to one correspondence between said bonding pads on said first and second wafers;
    positioning said first and second wafers such that said bonding pads on said first wafer are brought in contact with said bonding pads on said second wafer;
    causing said corresponding bonding pads to bond to one another; and
    thinning said second wafer by removing a portion of said second wafer by CMP of the surface of said second wafer that is not bonded to said first wafer, said stop layer in said vias determining the amount of material that is removed, wherein said vias are filled with a conducting material thereby forming a plug extending from said surface of said second wafer having said bonding pads to said stop layer and wherein said step of thinning said second wafer leaves a portion of said plugs elevated above said surface of said second wafer remaining after removing said portion of said second wafer.

2. The method of claim 1, wherein said stop material comprises a material chosen from the group consisting of Ta, TaN, W, WN and wherein said wafer material comprises silicon.

3. The method of claim 1 further comprising the steps of:
    providing a third wafer having bonding pads on one surface thereof, said bonding pads being positioned to engage said portions of said plugs that extend above said surface of said second wafer;
    positioning said third wafer relative to said second wafer such that said bonding pads on said third wafer will contact said portions of said plugs that extend over said surface on said second wafer when said second and third layers are brought together; and
    bonding a third wafer to said portions of said plugs that extend above said surface of said second wafer.

4. The method of claim 3 wherein said bonding pads on said surface of said third wafer comprise a depressed region sized to engage said elevated portions of said plugs on said surface of said second wafer.

5. The method of claim 3 wherein said step of positioning said third wafer comprises using said positions of said plugs in said second wafer to determine the relative position of said second and third wafers.

* * * * *